(12) United States Patent
Watabe et al.

(10) Patent No.: US 9,997,737 B2
(45) Date of Patent: Jun. 12, 2018

(54) DISPLAY DEVICE

(71) Applicant: Japan Display Inc., Tokyo (JP)

(72) Inventors: Kazufumi Watabe, Tokyo (JP);
Hiroshi Kawanago, Tokyo (JP)

(73) Assignee: Japan Display Inc., Tokyo (JP)

( * ) Notice: Subject to any disclaimer, the term of this patent is extended or adjusted under 35 U.S.C. 154(b) by 57 days.

(21) Appl. No.: 15/070,604

(22) Filed: Mar. 15, 2016

(65) Prior Publication Data

US 2016/0276625 A1  Sep. 22, 2016

(30) Foreign Application Priority Data

Mar. 18, 2015  (JP) .................................. 2015-054987

(51) Int. Cl.
| | | |
|---|---|---|
| H01L 27/00 | (2006.01) | |
| H01L 51/52 | (2006.01) | |
| H01L 51/56 | (2006.01) | |
| H01L 51/00 | (2006.01) | |
| H01L 27/32 | (2006.01) | |

(52) U.S. Cl.
CPC ...... H01L 51/5253 (2013.01); H01L 51/0009 (2013.01); H01L 51/0016 (2013.01); H01L 51/524 (2013.01); H01L 51/56 (2013.01); H01L 27/322 (2013.01); H01L 2227/326 (2013.01); H01L 2251/5338 (2013.01); H01L 2251/568 (2013.01)

(58) Field of Classification Search
CPC ............. H01L 27/1225; H01L 27/3276; H01L 27/323; H01L 27/3262; H01L 27/124; H01L 27/1255; H01L 27/127; H01L 27/1218; H01L 27/1222; H01L 27/1266; H01L 27/0688; H01L 27/1156; H01L 27/1214; H01L 27/01
USPC ............................... 257/43, 59, 99, 104, 300
See application file for complete search history.

(56) References Cited

U.S. PATENT DOCUMENTS

2015/0241718 A1* 8/2015 Jeong .................... G02F 1/1309
349/143

FOREIGN PATENT DOCUMENTS

JP  2008-159600 A  7/2008

* cited by examiner

*Primary Examiner* — Brett Feeney
*Assistant Examiner* — Rodolfo Fortich
(74) *Attorney, Agent, or Firm* — Typha IP LLC

(57) ABSTRACT

A structure including a first resin layer and a second resin layer sandwiching a self-light emitting element layer, a first stopper layer, a first resin sacrificial layer and a first glass substrate which are stacked on the first resin layer on the opposite side of the self-light emitting element layer, and a second glass substrate stacked on the second resin layer is prepared. The first glass substrate is peeled off from the first resin sacrificial layer by irradiating the first glass substrate with a laser beam. The first resin sacrificial layer is decomposed by a chemical reaction using a gas. The first stopper layer has a resistance to the chemical reaction, and the first resin sacrificial layer is removed while leaving the first stopper layer in a step of decomposing the first resin sacrificial layer.

14 Claims, 15 Drawing Sheets

DISPLAY DEVICE

CROSS-REFERENCE TO RELATED APPLICATION

The present application claims priority from Japanese application JP2015-054987 filed on Mar. 18, 2015, the content of which is hereby incorporated by reference into this application.

BACKGROUND OF THE INVENTION

1. Field of the Invention

The present invention relates to a display device and a method of manufacturing the display device.

2. Description of the Related Art

In manufacturing processes for manufacturing a sheet-shaped display device, there is a process in which a resin layer is peeled off from a glass substrate by using a laser beam and so on after the resin layer such as polyimide and a self-light emitting element layer are stacked on the glass substrate. More specifically, the resin layer is peeled off from the glass substrate by ablation of a material occurring due to energy of the laser beam on a surface of the resin layer. At this time, a minute product generated by ablation may adhere to the surface of the resin layer and remain thereon. The product (hereinafter referred to also as a "residual product") will be also a factor of reduction of yields and a factor of deterioration in display quality due to mixing of bubbles and so on in subsequent processes.

As a method of removing the residual product, a dry air cleaning or a wet cleaning (for example, a pure water cleaning) can be cited. When performing the wet cleaning, there is a concern that the resin layer absorbs moisture and the moisture reaches the self-light emitting element layer to cause deterioration.

In JP 2008-159600 A, a structure in which infiltration of moisture is prevented by surrounding a layer having a property absorbing moisture with a first and second moisture block layers.

However, there may be a case where the residual product adheres firmly by static electricity, and there is a concern that the residual product still remains on the surface even when using the above removal method.

SUMMARY OF THE INVENTION

An object of the present invention is to provide a method of manufacturing a display device capable of removing a residual product more effectively as compared with a case where the dry air cleaning or the wet cleaning is used.

According to an embodiment of the present invention, there is provided a method of manufacturing a display device including the steps of preparing a structure including a self-light emitting element layer which plural self-light emitting type pixels comprise, a first resin layer and a second resin layer sandwiching the self-light emitting element layer, a first stopper layer stacked on the first resin layer on the opposite side of the self-light emitting element layer, a first resin sacrificial layer stacked on the first stopper layer on the opposite side of the self-light emitting element layer, a first glass substrate stacked on the first resin sacrificial layer on the opposite side of the self-light emitting element layer, and a second glass substrate stacked on the second resin layer on the opposite side of the self-light emitting element layer, peeling off the first glass substrate from the first resin sacrificial layer by irradiating the first glass substrate with a laser beam and decomposing the first resin sacrificial layer by a chemical reaction using a gas, in which the first stopper layer has a resistance to the chemical reaction, and the first resin sacrificial layer is removed while leaving the first stopper layer in the step of decomposing the first resin sacrificial layer. According to the method, it is possible to remove the residual product effectively as compared with the case of using the dry air cleaning or the wet cleaning.

DETAILED DESCRIPTION OF THE INVENTION

Figure 1:
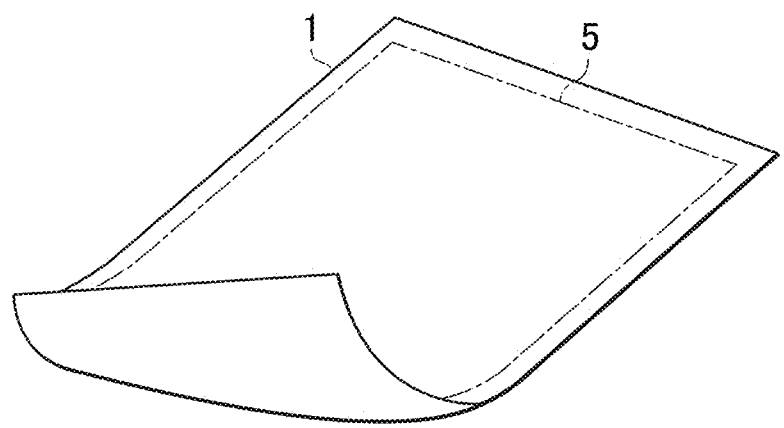
FIG. 1 is a perspective view of a display device according to an embodiment of the present invention.

Hereinafter, a mode for carrying out the invention (hereinafter referred to as an embodiment) will be explained. The disclosure of the specification is just an example of the present invention, and proper alternations keeping the gist of the present invention, at which those skilled in the art can easily arrive are included in the scope of the invention. The width, the thickness, the shape and so on of respective parts shown in the drawings are schematically shown, which do not limit the interpretation of the present invention.

1. Outer Appearance of Display Device

FIG. 1 is a perspective view showing an outer appearance of a display device 1 according to the embodiment of the present invention. The display device 1 formed in a sheet shape has flexibility, which is capable of display the contents of acquired image information and the like on a display area 5 formed on a surface of the display device 1 even when the display device is bent.

2. Configuration of Display Device

Figure 2:
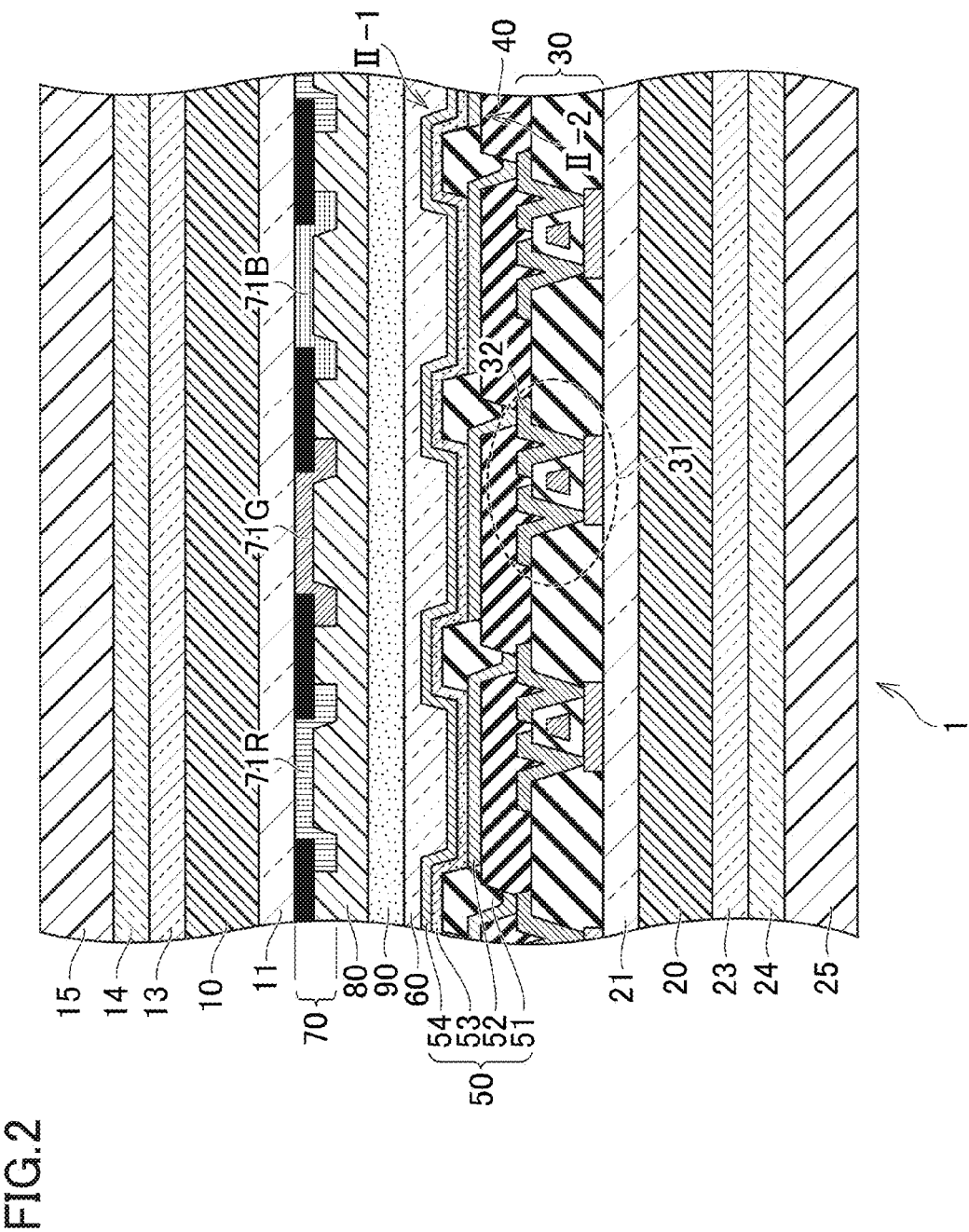
FIG. 2 is a cross-sectional view showing an example of a configuration of the display device.

FIG. 2 is a cross-sectional view showing an example of a configuration of the display device 1. As shown in the drawing, a self-light emitting element layer 50 including self-light emitting type light emitting elements is formed in the display device 1. Here, the self-light emitting element layer 50 is a layer formed in a planar shape, having two surfaces corresponding to a surface and a rear surface. In the following description, one surface of the self-light emitting element layer 50 is referred to as a first surface and the other surface of the self-light emitting element layer 50 is referred to as a second surface. In the cross-sectional view of FIG. 2, an upper surface (II-1) of the self-light emitting element layer 50 corresponds to the first surface and a lower surface (II-2) corresponds to the second surface.

Also as shown in FIG. 2, a sealing layer 60, a filling layer 90, an overcoat layer 80, a color filter layer 70, a first barrier layer 11, a first resin layer 10, a first stopper layer 13 and a first repair layer 14 are stacked on the first surface's side of the self-light emitting element layer 50, and a first protective film 15 is bonded to an outer surface of the first repair layer 14. Also as shown in the drawing, a planarization layer 40, a circuit layer 30, a second barrier layer 21, a second resin layer 20, a second stopper layer 23 and a second repair layer 24 are stacked on the second surface's side of the self-light emitting element layer 50, and a second protective film 25 is bonded to an outer surface of the second repair layer 24.

The display device 1 according to the embodiment adopts a top emission type, which is configured to emit light from the first surface's side of the self-light emitting element layer 50. Accordingly, the sealing layer 60, the filling layer 90, the overcoat layer 80, the color filter layer 70, the first barrier layer 11, the first resin layer 10, the first stopper layer 13 and the first repair layer 14 and the first protective film 15 are respectively formed of materials which transmit light (transparent materials, semitransparent materials colored by given colors or the like).

Here, plural self-light emitting type pixels formed by the self-light emitting element layer 50 are provided in the display area 5 of the display device 1 (see FIG. 1). More specifically, the self-light emitting element layer 50 is formed by including an organic layer 53 in which a charge transfer layer, a charge injection layer, light emitting elements and so on are stacked as shown in FIG. 2. When electricity flows in the organic layer 53, the self-light emitting element layer 50 emits light of pixels.

Also as shown in FIG. 2, a bank layer 51, pixel electrodes 52 and a common electrode 54 are formed in the self-light emitting element layer 50 so as to cover a surface and a rear surface of the organic layer 53. Here, the bank layer 51 is formed of an insulator such as a resin, which is arranged so as to surround respective outer peripheries of plural pixels. The bank layer 51 is arranged in this manner, thereby preventing contact of pixel electrodes 52 adjacent between pixels.

The pixel electrodes 52 are formed of a given conductive material and processed (for example, etching processing) so as to be cut off from one another in respective pixels. When the top emission type is adopted as in the embodiment, the pixel electrodes 52 may include a material which reflects light such as metals (for example, Ag). The common electrode 54 is formed of ITO (Indium Tin Oxide) or IZO (indium zinc oxide), however, materials are not limited to them as long as they are transparent conductive materials. The organic layer 53 and the common electrode 54 may be arranged over the entire pixels in the display area 5.

Also as shown in FIG. 2, the planarization layer 40 and the circuit layer 30 are stacked on the second surface's side of the self-light emitting element layer 50. Here, the planarization layer 40 is formed of an insulator such as a resin, and has holes formed at positions contacting parts of a later-described drive wiring 32. Part of the pixel electrode 52 enters the hole and contacts the drive wiring 32.

The circuit layer 30 is formed by including circuit portions 31 for controlling image display in the display area 5. The circuit portion 31 includes a TFT (thin-film transistor) and a capacitance, controlling the supply of electric current with respect to the pixel electrode 52. More specifically, when the drive TFTs included in the circuit portions 31 are turned on, the electric current flows in the drive wiring 32 connected to the drive TFTs, the pixel electrodes 52, the organic layer 53, and the common electrode 54 which are electrically connected to the drive wiring 32 to thereby emit light of pixels from the organic layer 53.

Furthermore, as shown in FIG. 2, the color filter layer 70 is formed on the first surface's side of the self-light emitting element layer 50. Here, the color filter layer 70 is formed by including color filters 71R, 71G and 71B which are red, green and blue and are respectively transmit light. Here, when light emitted from the organic layer 53 is transmitted through the above color filters 71R, 71G and 71B, light corresponding to a color of a pixel is emitted.

Also as shown in FIG. 2, the sealing layer 60, the filling layer 90 and the overcoat layer 80 are stacked between the self-light emitting element layer 50 and the color filter layer 70. The sealing layer 60 is formed of SiO or SiN, having a function of protecting the self-light emitting element layer 50 from moisture included in the filling layer 90. The overcoat layer 80 is formed of, for example, an organic material, having a function of preventing diffusion of dyes of colors included in the color filters 71R, 71G and 71B. The details of the filling layer 90 will be described later.

Also as shown as FIG. 2, the first resin layer 10 is formed on the first surface's side of the self-light emitting element layer 50 and the second resin layer 20 is formed on the second surface's side of the self-light emitting element layer 50 in the display device 1. The first resin layer 10 and the second resin layer 20 have flexibility and allow bending in a vertical direction in the cross section of FIG. 2 and stretching in a direction along the surface of the display device 1 to some degree. The material for the first resin layer 10 and the second resin layer 20 may be polyimide, however, it is not limited to this as long as materials have flexibility and transmit light when used for the first resin layer 10. The second resin layer 20 may be formed to be opaque if it is not necessary to transmit light from the self-light emitting element layer 50 or from the back of the display device 1.

Also as shown as FIG. 2, the first barrier layer 11 is formed between the first resin layer 10 and the color filter layer 70, and the second barrier layer 21 is formed between the second resin layer 20 and the circuit layer 30. The first barrier layer 11 and the second barrier layer 21 are for preventing infiltration of moisture and impurities to the self-light emitting element layer 50, the circuit layer 30 and so on, which are formed by stacking, for example, SiO and SiN.

Also as shown as FIG. 2, the first stopper layer 13 and the second stopper layer 23, the first repair layer 14 and the second repair layer 24, the first protective film 15 and the second protective film 25 are respectively stacked in the display device 1. The first protective film 15 and the second protective film 25 are layers for protecting layers inside these films from scratches and stains. The first protective film 15 and the second protective film 25 are formed by using, for example, PET as a material, having adhesion layers (not shown) for adhering to respective surfaces of the first stopper layer 13 and the second stopper layer 23. The first stopper layer 13, the second stopper layer 23, the first repair layer 14 and the second repair layer 24 will be explained later.

3. Method of Manufacturing Display Device

Here, a method of manufacturing the display device 1 according to the embodiment will be explained with reference to FIG. 3 to FIG. 9.

Figure 3:
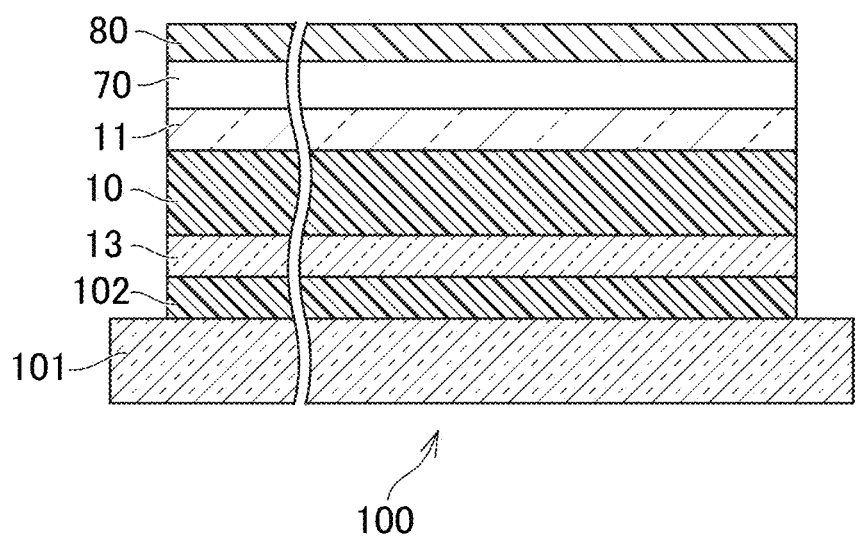
FIG. 3 is a schematic cross-sectional view showing a first structure as a portion of the display device in a manufacturing stage.

FIG. 3 is a schematic cross-sectional view showing a first structure as a portion of the display device 1 in a manufacturing stage. As shown in FIG. 3, a first structure 100 in which a first resin sacrificial layer 102, the first stopper layer 13, the first resin layer 10, the first barrier layer 11, the color filter layer 70 and the overcoat layer 80 are stacked in this order on a first glass substrate 101 is prepared in a manufacturing process of the display device 1.

Here, the first resin sacrificial layer 102 is a layer decomposed and removed from the first stopper layer 13 in a subsequent process for preventing adverse effects to the first resin layer 10 at the time of peeling off the first glass substrate 101 and for removing a residual product 105 adhering at that time. The first resin sacrificial layer 102 is formed by using polyimide as a material in the same manner as the first resin layer 10 as an example. In this case, the first resin sacrificial layer 102 may be formed by a method of applying a solution of polyimide on the first glass substrate 101 and baking and hardening the solution by baking treatment, and the first resin sacrificial layer 102 may also be formed by adhering a film sheet of polyimide to the first glass substrate 101.

The first stopper layer 13 has a function of protecting the first resin layer 10 when the first resin scarifying layer 102 is decomposed in the subsequent process. As materials for the first stopper layer 13, SiO, SiN, ITO, IZO, Al2O3 and so on can be cited. The first stopper layer 13 may be formed by including SiO or SiN by using a CVD method, may be formed by including ITO or IZO by a using sputtering method, and may be formed by using Al2O3 by using an ALD (Atomic layer deposition) method. The first stopper layer 13 is formed to be transparent so as to transmit light of pixels emitted from the self-light emitting element layer 50.

Figure 4:
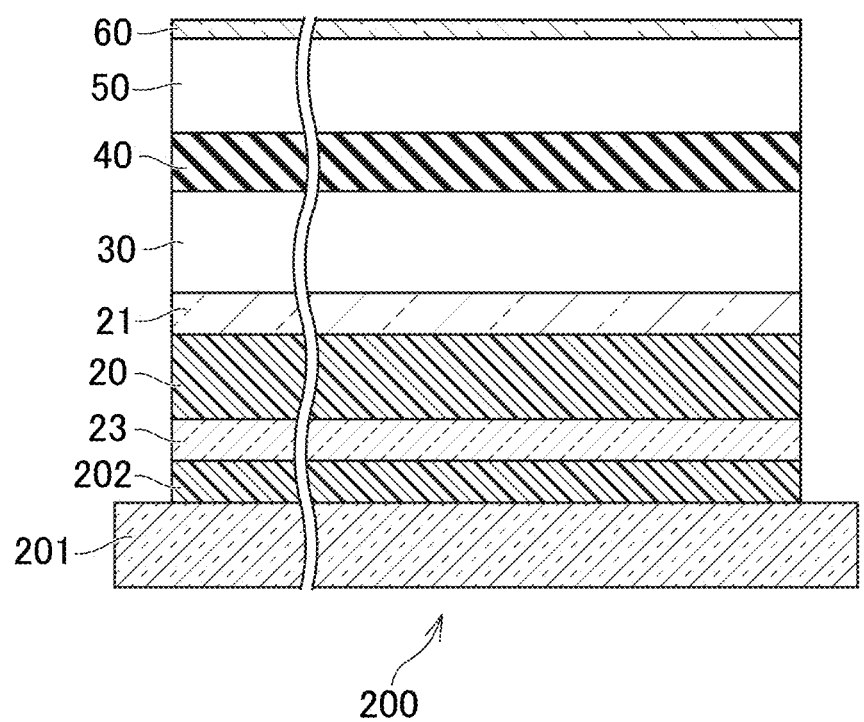
FIG. 4 is a schematic cross-sectional view showing a second structure as a portion of the display device in a manufacturing stage.

FIG. 4 is a schematic cross-sectional view showing a second structure as a portion of the display device 1 in a manufacturing stage. As shown in FIG. 4, a second structure 200 in which a second resin sacrificial layer 202, the second stopper layer 23, the second resin layer 20, the second barrier layer 21, the circuit layer 30, the planarization layer 40, the self-light emitting element layer 50 and the sealing layer 60 are stacked in this order on a second glass substrate 201 is prepared in a manufacturing process of the display device 1.

Here, the second resin sacrificial layer 202 is a layer decomposed and removed from the second stopper layer 23 in a subsequent process for preventing adverse effects to the second resin layer 20 at the time of peeling off the second glass substrate 201 and for removing a residual product 205 adhering at that time. The second resin sacrificial layer 202 is formed by using polyimide as a material as an example in the same manner as the second resin layer 20, the first resin layer 10 and the first resin sacrificial layer 102.

The second stopper layer 23 has a function of protecting the second resin layer 20 when the second resin scarifying layer 202 is decomposed in the subsequent process. The second stopper layer 23 may be formed by using, for example, SiO, SiN, ITO, IZO, Al2O3 and so on as materials in the same manner as the first stopper layer 13. The second stopper layer 23 may be formed to be opaque.

Figure 5:
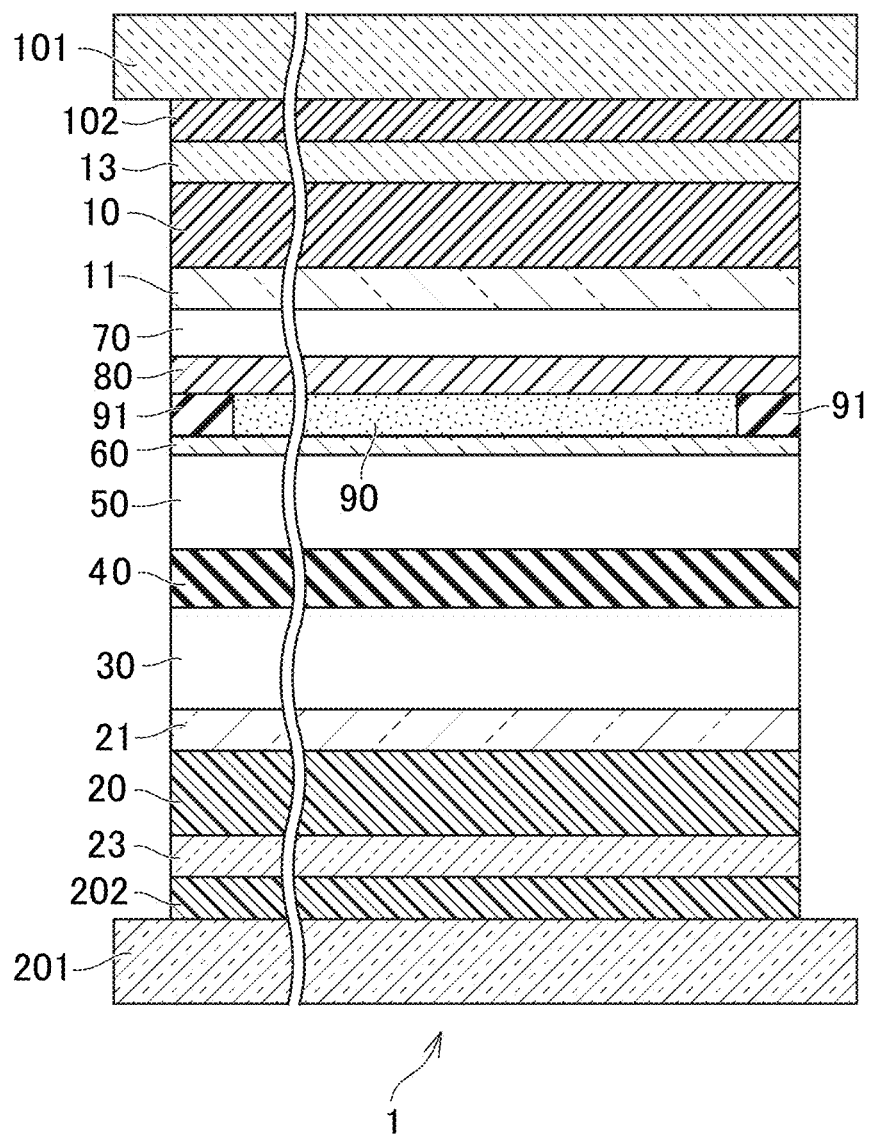
FIG. 5 is a schematic cross-sectional view showing the display device in a manufacturing stage.

FIG. 5 shows the display device 1 in a manufacturing stage, which is a schematic cross-sectional view showing a structure in which the first structure 100 and the second structure 200 are bonded to each other through the filling layer 90. The filling layer 90 is formed by including a transparent filler and a seal material 91 functioning as a dam for the filler. In a manufacturing process of the display device 1, the filling layer 90 is arranged on the second structure 200 shown in FIG. 4, and the first structure 100 shown in FIG. 3 is bonded thereto by turning over the first structure 100 shown in FIG. 3 in the vertical direction, thereby forming one structure as the display device 1.

As described above, in the manufacturing process of the display device 1 according to the embodiment, the structure including the self-light emitting element layer 50, the first resin layer 10 and the second resin layer 20 sandwiching the self-light emitting element layer 50, the first stopper layer 13 stacked on the first resin layer 10 on the opposite side of the self-light emitting element layer 50, the first resin sacrificial layer 102 staked on the first stopper layer 13 on the opposite side of the self-light emitting element layer 50, the first glass substrate 101 staked on the first resin sacrificial layer 102 on the opposite side of the self-light emitting element layer 50 and the second glass substrate 201 staked on the second resin layer on the opposite side of the self-light emitting element layer 50 is prepared. The structure further includes the second stopper layer 23 staked on the second resin layer on the opposite side of the self-light emitting element layer 50 and the second resin sacrificial layer 202 staked on the second stopper layer 23 on the opposite side of the self-light emitting element layer 50, and the second glass substrate 201 is staked on the second resin sacrificial layer 202 on the opposite side of the self-light emitting element layer 50. The structure further includes the color filter layer 70 interposed between the self-light emitting element layer 50 and the first resin layer 10 and the circuit layer interposed between the self-light emitting element layer 50 and the second resin layer 20.

Figure 6:
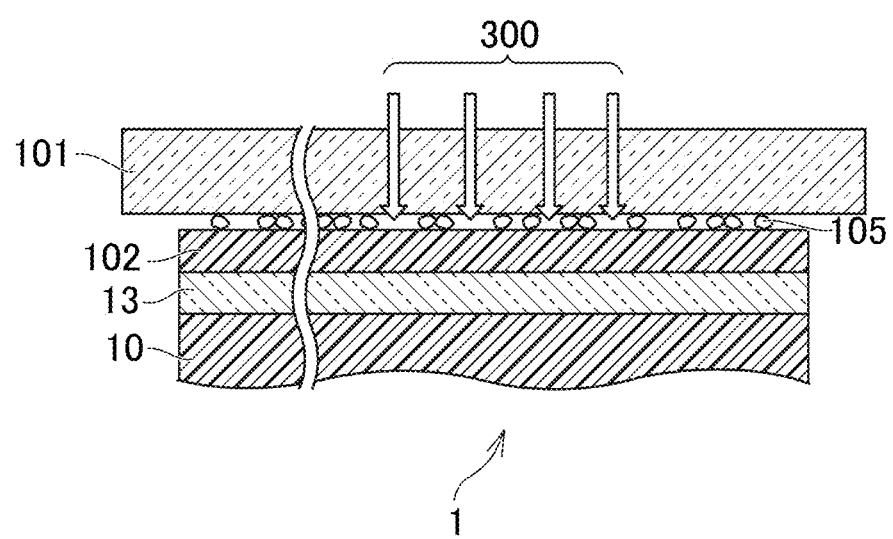
FIG. 6 is a schematic cross-sectional view showing a portion of the display device in a manufacturing stage.

FIG. 6 is a schematic cross-sectional view showing a portion of the display device 1 in a manufacturing stage, which is a view showing an example of a stage where the first glass substrate 101 is peeled off from the display device 1. In the manufacturing process of the display device 1, the first glass substrate 101 is irradiated with a laser beam 300 to change a property of a contact surface of the first resin sacrificial layer 102 contacting the first glass substrate 101 by heat, thereby peeling off the first glass substrate 101 from the first resin sacrificial layer 102. That is, ablation due to the layer beam 300 occurs on the surface of the first resin sacrificial layer 102, the first resin sacrificial layer 102 is peeled off from the first glass substrate 101.

As the first resin sacrificial layer 102 is further stacked on the first resin layer 10 in the manufacturing method according to the embodiment, the thickness of the resin layer can be increased at the time of irradiation of the laser beam 300 as compared with a related-art method in which only the first resin layer 10 is stacked. Therefore, the adverse effects (damage to the self-light emitting element layer 50 and so on) to the self-light emitting element layer 50 due to laser energy of the laser beam 300 can be reduced.

Here, the minute residual product 105 mainly containing carbon is generated on a surface of the first resin sacrificial layer 102 by the ablation due to the laser beam 300. The residual product 105 adheres to the surface of the first resin sacrificial layer 102 at the time of peeling off the first glass substrate 101.

Incidentally, in the case where the protective film is bonded to the surface in a state where the residual product 105 adheres to the surface, bubbles easily enter the inside of the protective film due to the influence of the residual product 105, which will be a factor of reducing yields. Accordingly, it is necessary to remove the residual product 105 from the surface of the display device 1, however, most of the residual products 105 have sizes smaller than 1 μm, and may adhere firmly by static electricity. Therefore, the residual product 105 may still remain on the surface of the display device 1 even when a dry air cleaning or a wet cleaning is used.

When irradiation of the laser beam 300 is performed in a state where there is a foreign matter on the first resin sacrificial layer 102, the first resin sacrificial layer 102 is chipped as the foreign matter is burned or sublimes, which causes the reduction of yields in subsequent processes.

Accordingly, in the manufacturing process of the display device 1, the residual product 105 is removed together with the first resin sacrificial layer 102 by decomposing the first resin sacrificial layer 102 by a chemical reaction using a gas containing oxygen, fluorine or the like.

Figure 7:
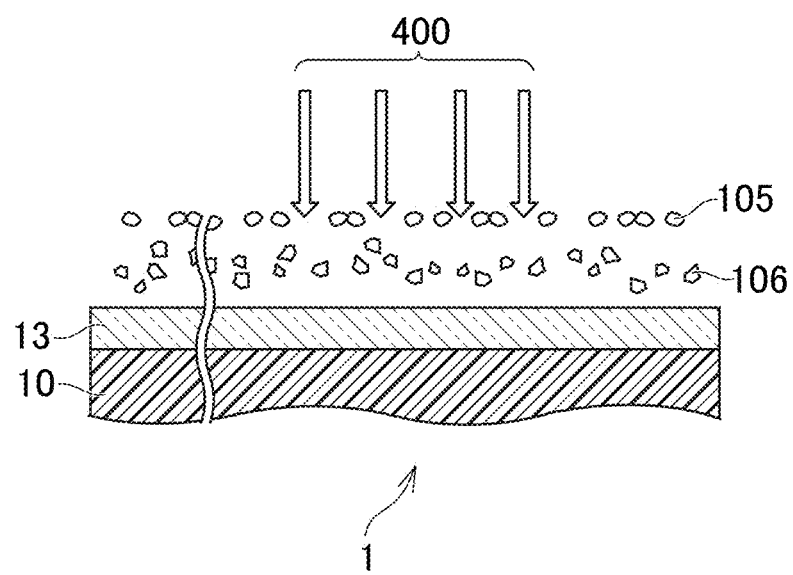
FIG. 7 is a schematic cross-sectional view showing a portion of the display device in a manufacturing stage.

FIG. 7 is a schematic cross-sectional view showing a portion of the display device 1 in a manufacturing stage, which is a view showing an example of a stage in which the first resin sacrificial layer 102 is removed from the portion of the display device 1 shown in FIG. 6. As shown in FIG. 7, the first resin sacrificial layer 102 is decomposed into an organic compound 106, for example, by performing processing (dry etching) in which gas containing oxygen or fluorine is converted into plasma by high frequency and a generated plasma 400 is applied to the first resin sacrificial layer 102 to be chemically reacted.

Though the first resin sacrificial layer 102 is decomposed by the above chemical reaction, the first stopper layer 13 has a resistance to the chemical reaction, and the first stopper layer 13 is not decomposed and remains in the above process. In the manufacturing process of the display device 1, the first resin sacrificial layer 102 is removed together with the residual product 105 while leaving the first stopper layer 13. According to this process, the residual product 105 does not remain on the surface of the first stopper layer 13 and progress of the chemical reaction to the first resin layer 10 is suppressed, therefore, the reduction of yields in subsequent processes can be prevented.

Figure 8:
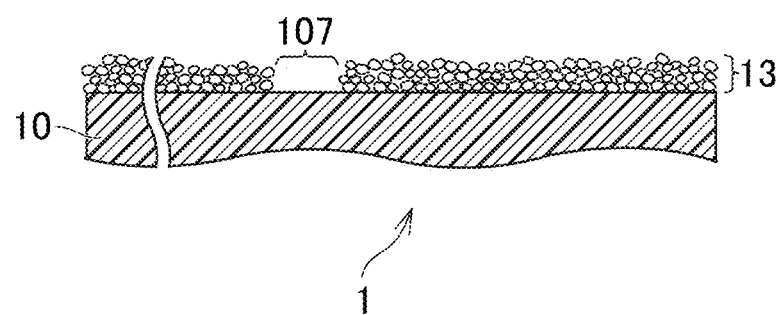
FIG. 8 is a schematic cross-sectional view showing a portion of the display device in a manufacturing stage.

FIG. 8 is a schematic cross-sectional view showing a portion of the display device 1 in a manufacturing stage, which is a view showing an example in which the portion of the display device 1 shown in FIG. 7 is enlarged. As shown in FIG. 8, a chipped portion (hereinafter also referred to as a first pinhole 107) may be generated in the first stopper 13. The first pinhole 107 is generated in a stage of forming the first stopper layer 13 by the CVD method or generated when a foreign matter mixed in the first stopper layer 13 reacts with the plasma 400 in the chemical reaction processing (for example, dry etching) at the time of removing the first resin sacrificial layer 102. In the case where the first protective film 15 is bonded to the first stopper layer 13 in a state where the first pinhole 107 remains in the above manner, moisture remaining in the first protective film 15 or moisture infiltrated from the outside thereof reaches the first resin layer 10, which leads to deterioration.

Accordingly, in the manufacturing process of the display device 1, the first repair layer 14 is formed over the first stopper layer 13 after the process of decomposing the first resin sacrificial layer 102, and the first protective film 15 is bonded to a surface of the first repair layer 14.

Figure 9:
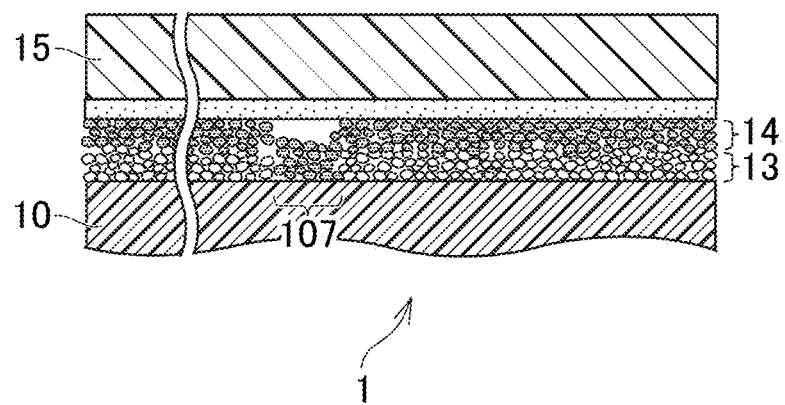
FIG. 9 is a schematic cross-sectional view showing a portion of the display device in a manufacturing stage.

FIG. 9 is a schematic cross-sectional view showing a portion of the display device 1 in a manufacturing stage, which is a view showing an example in which the first repair layer 14 and the first protective film 15 are formed in the display device 1 shown in FIG. 8. As shown in FIG. 9, the first repair layer 14 is provided so as to bury the first pinhole 107 in the first stopper layer 13. The first repair layer 14 may have a single-layer structure including SiO, SiN, acrylic, PET, a fluorine resin or the like, a stacked-layer structure including Al2O3 and SiO (or SiN), a stacked-layer structure including acrylic and SiO (or SiN) or the like. When the first repair layer 14 is provided between the first stopper layer 13 and the first protective film 15, it is possible to improve an ability of blocking moisture infiltrated through the first protective film 15.

Figure 10:
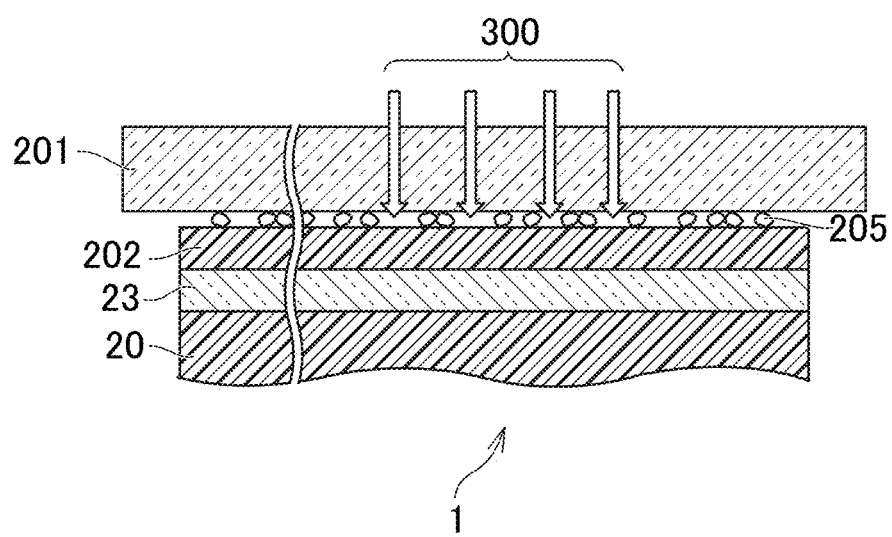
FIG. 10 is a schematic cross-sectional view showing a portion of the display device in a manufacturing stage.

FIG. 10 is a schematic cross-sectional view showing a portion of the display device 1 in a manufacturing stage, which is a view showing a state in which the second glass substrate 201 is peeled off from the display device 1. In the manufacturing process of the display device 1, the second glass substrate 201 stacked on the second surface's side of the self-light emitting element layer 50 is irradiated with the laser beam 300 after the first protective film 15 is bonded, a property of a contact surface of the second resin sacrificial layer 202 contacting the second glass substrate 201 is changed by heat, thereby peeling off the second glass substrate 201 from the second resin sacrificial layer 202. Also in this case, the minute residual product 205 is generated on the contact surface of the second resin sacrificial layer 202 and adheres to the surface of the second resin sacrificial layer 202 in the same manner as in the case of peeling off the first glass substrate 101.

Figure 11:
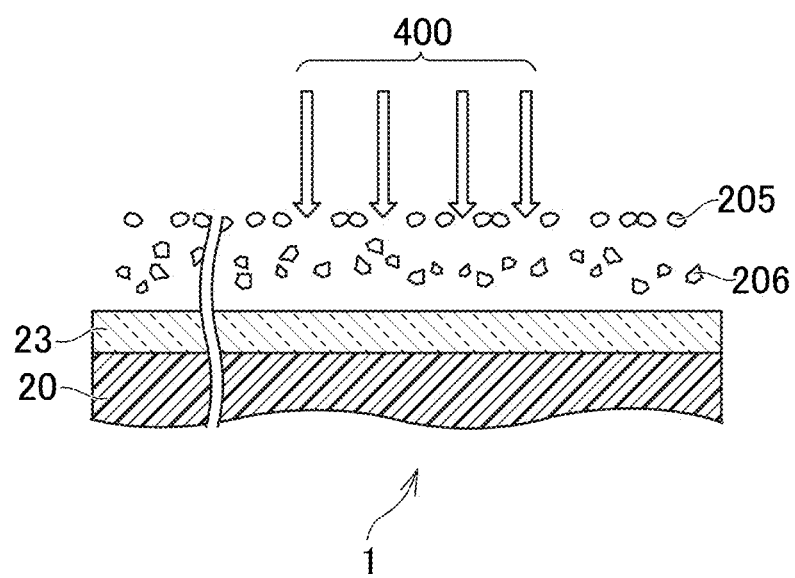
FIG. 11 is a schematic cross-sectional view showing a portion of the display device in a manufacturing stage.

FIG. 11 is a schematic cross-sectional view showing a portion of the display device 1 in a manufacturing stage, which is a view showing a state where the second sacrificial layer 202 is removed from the portion of the display device 1 shown in FIG. 10. In the manufacturing process of the display device 1, the residual product 205 is removed from the surface of the display device 1 in the forming stage by decomposing the second resin sacrificial layer 202 into an organic compound 206 by the chemical reaction (dry etching) using the gas containing oxygen or fluorine. Here, the second stopper layer 23 may be formed by the same material and method as the first stopper layer 13, and the second stopper layer 23 has a resistance to the chemical reaction using the gas. Accordingly, the second resin sacrificial layer 202 is removed while leaving the second stopper layer 23 by using the chemical reaction such as dry etching in the present process. As the residual product 205 is removed together with the second resin sacrificial layer 202 also in the second surface's side of the self-light emitting element layer 50 and the progress of the chemical reaction to the second resin layer 20 is suppressed as described above, the reduction of yields in subsequent processes can be prevented.

Figure 12:
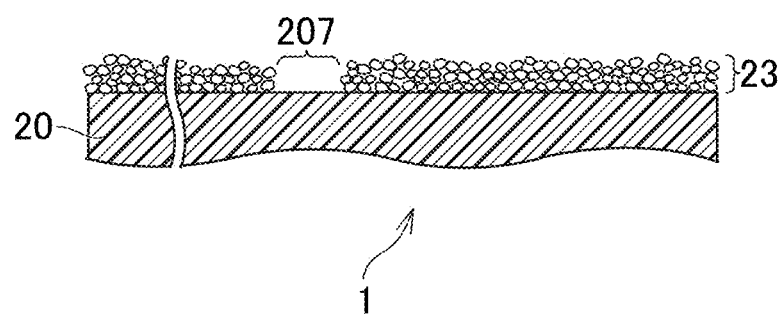
FIG. 12 is a schematic cross-sectional view showing a portion of the display device in a manufacturing stage.

FIG. 12 is a schematic cross-sectional view showing a portion of the display device 1 in a manufacturing stage, which is a view showing an example in which the portion of the display device 1 shown in FIG. 11 is enlarged. As shown in FIG. 12, a chipped portion (hereinafter also referred to as a second pinhole 207) may occur in the second stopper 23 due to mixing of a foreign matter in the process of decomposing the second resin sacrificial layer 202.

Accordingly, in the manufacturing process of the display device 1, the second repair layer 24 is formed over the second stopper layer 23 after the process of decomposing the second resin sacrificial layer 202, and the second protective film 25 is bonded to a surface of the second repair layer 24.

Figure 13:
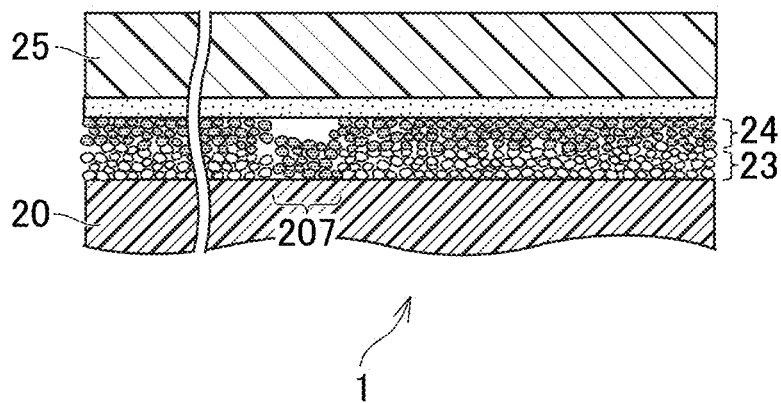
FIG. 13 is a schematic cross-sectional view showing a portion of the display device in a manufacturing stage.

FIG. 13 is a schematic cross-sectional view showing a portion of the display device 1 in a manufacturing stage, which is a view showing an example in which the second repair layer 24 and the second protective film 25 are formed in the display device 1 shown in FIG. 12. As shown in FIG. 13, the second repair layer 24 is provided so as to bury the second pinhole 207 in the second stopper layer 23, namely, so as to repair the defect of the second repair layer 24. The second repair layer 24 may be formed of the same materials as the first repair layer 14 and by the same method as the first repair layer 14. When the second repair layer 24 is provided between the second stopper layer 23 and the second protective film 25, it is possible to improve an ability of blocking moisture infiltrated through the second protective film 25 also on the second surface's side.

4. Modification Examples

The present invention is not limited to the above explained embodiment and may be modified in various ways. Hereinafter, examples of other modes for carrying out the present invention (modification examples) will be explained.

(1) In the embodiment, the method of manufacturing the display device 1 which has steps of forming the first resin sacrificial layer 102 and the second resin sacrificial layer 202 on the surface side and the rear surface side of the display device 1 respectively and removing these layers by the chemical processing to thereby remove the residual product 105 has been explained. However, light of pixels emitted from the self-light emitting element layer 50 is transmitted through the first resin layer 10 and outputted from a surface on one side of the display device 1, therefore, if bubbles are mixed to the surface of the second resin layer 20, the display of images is hardly affected. Accordingly, remanence of the residual product generated at the time of peeling off the glass substrate is allowed on the second surface's side in the display device 1 in the modification example.

Figure 14:
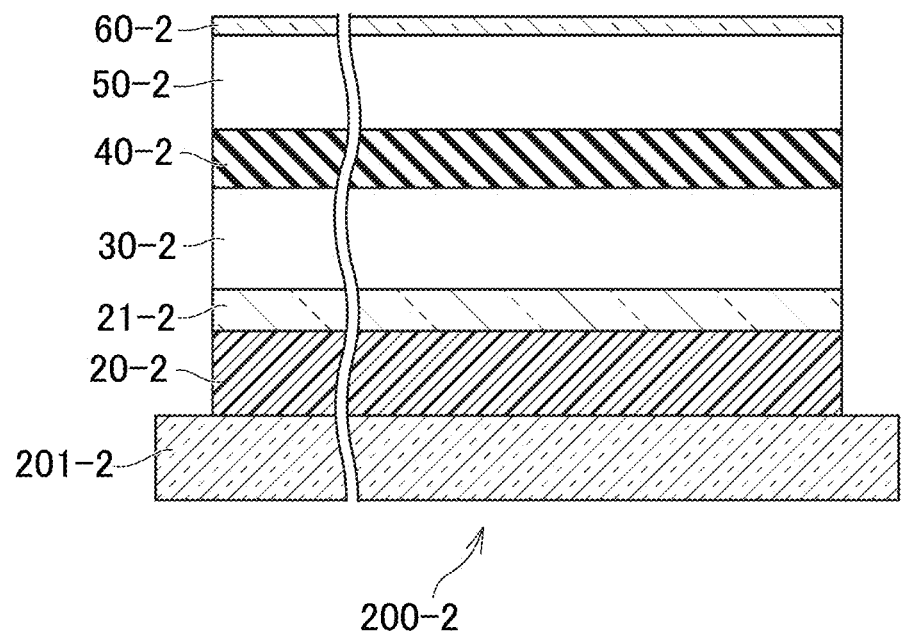
FIG. 14 is a schematic cross-sectional view showing a second structure formed in a modification example.

FIG. 14 is a schematic cross-sectional view showing a second structure formed in the modification example. As shown in FIG. 14, in the second structure (200-2) according to the modification example, the second stopper layer 23 and the second resin sacrificial layer 202 (refer to FIG. 4) are not formed and a second resin layer (20-2) is stacked so as to contact a glass substrate (201-2). The second structure (200-2) is bonded to the first structure (see FIG. 3) which is the same as the embodiment to form one structure to be a base of a display device (1-2).

Also in the manufacturing process of the display device (1-2: see FIG. 15) according to the modification example, the glass substrate (201-2) is peeled off from the second resin layer (20-2) by irradiation of the laser beam. At this time, ablation occurs on a contact surface of the second resin layer (20-2), and a residual product (205-2) (not shown) is generated in the same manner as the embodiment and adheres to the surface of the second resin layer (20-2).

Figure 15:
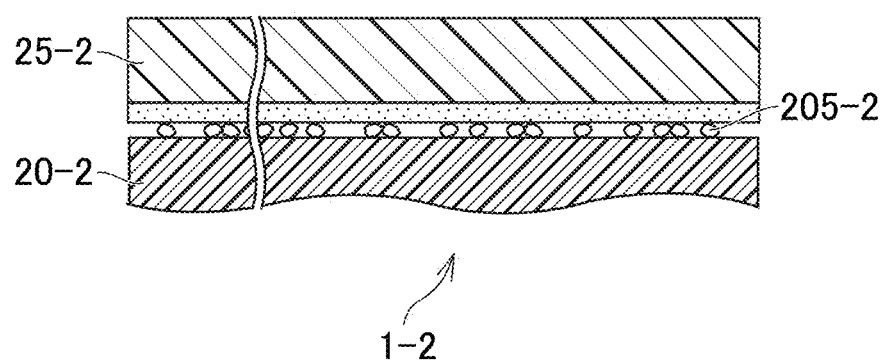
FIG. 15 is a schematic cross-sectional view showing a portion of a display device formed in the modification example.

FIG. 15 is a schematic cross-sectional view showing a portion of the display device (1-2) formed in the modification example. As shown in FIG. 15, a second protective film (25-2) is bonded in a state where the residual product (205-2) adheres to the surface of the second resin layer (20-2). The risk in which bubbles enter the inside of the second protective film (25-2) is increased by the above processing, the process of forming the second stopper layer 23 and the second resin sacrificial layer 202 and the process of removing the second resin sacrificial layer 202 performed in the embodiment can be omitted, therefore, it is possible to manufacture the display device simply and inexpensively as compared with the embodiment.

(2) In the embodiment, the case where the sealing layer 60, the filling layer 90, the overcoat layer 80, the color filter layer 70, the second barrier layer 21, the second resin layer 20, the second stopper layer 23, the second repair layer 24 and the second protective film 25 are formed of materials which transmit light (transparent materials, semitransparent materials colored to given colors and so on) which are arranged on the second surface's side for emitting light of pixels from the second surface's side of the self-light emitting element layer 50 in the display device 1 has been explained. However, members other than the above may be transparent for allowing light incident from the back of the display device 1 to be transmitted therethrough. That is, the planarization layer 40, the circuit layer 30, the second barrier layer 21, the second resin layer 20, the second stopper layer 23, the second repair layer 24, the second protective film 25 may be respectively formed of transparent or semitransparent materials for allowing light from the back to be transmitted therethrough.

While there have been described what are at present considered to be certain embodiments of the invention, it will be understood that various modifications may be made thereto, and it is intended that the appended claim cover all such modifications as fall within the true spirit and scope of the invention.

What is claimed is:
1. A display device comprising:
a self-light emitting element layer which plural self-light emitting type pixels comprise;
a first resin layer stacked on a first surface's side of the self-light emitting element layer;
a first stopper layer covering the first resin layer and made of an inorganic material;
a first repair layer covering the first stopper layer;
a first protective film bonded to the first repair layer;
a second resin layer stacked on a second surface's side of the self-light emitting element layer;
a second stopper layer covering the second resin layer and made of an inorganic material;
a second repair layer covering the second stopper layer; and
a second protective film bonded to the second repair layer, wherein
the first stopper layer has a first pinhole,
the first repair layer is provided so as to bury the first pinhole,
the second stopper layer has a second pinhole, and
the second repair layer is provided so as to bury the second pinhole.
2. A display device comprising:
a first protection film including a first resin layer;
a first adhesive layer on the first protection film;
a first repair layer which is arranged on the first adhesive layer and includes a first material;
a first stopper layer which is arranged on the first repair layer and includes a second material;
a first flexible substrate on the first stopper layer;

a function layer which is arranged on the first flexile substrate and includes a plurality of pixels arranged in a matrix, each of the plurality of pixels including a thin film transistor and an organic emitting element connected to the thin film transistor;

a second flexible substrate on the function layer;

a second stopper layer which is arranged on the second flexible substrate and includes a third material;

a second repair layer which is arranged on the second stopper layer and includes a fourth material;

a second adhesive layer on the second repair layer; and a second protection film which is arranged on the second adhesive layer and includes a second resin layer, wherein in plan view, each of the first protection film, the first adhesive layer, the first repair layer, the first stopper layer, the first flexible substrate, the second flexible substrate, the second stopper layer, the second repair layer, the second adhesive layer, and the second protection film covers the plurality of pixels and the first material differs from the second material, and the third material differs from fourth material.

3. The display device according to claim 2, wherein in plan view, each of the first protection film, the first adhesive layer, the first repair layer, the first stopper layer, the first flexible substrate, the second flexible substrate, the second stopper layer, the second repair layer, the second adhesive layer, and the second protection film covers all of the plurality of pixels.

4. The display device according to claim 2, further comprising:

a sealing film which includes a first region having a first width and a second region having a second width; and a filler including a resin material, wherein the organic light emitting element includes an anode; an organic light emitting layer on the anode; and a cathode on the organic light emitting layer, the function layer includes an insulation bank which is between the anode and the cathode, covers a peripheral region of an upper surface of the anode, and expose a central region of the upper surface of the anode, the first width directly above the peripheral region is smaller than the second width directly above the central region, and the first material is a first inorganic material, the second material is a second inorganic material, the third material is a third inorganic material, and the fourth material is a fourth inorganic material.

5. The display device according to claim 2, wherein the first stopper layer has a first pinhole penetrating the first stopper layer, a part of the first repair layer buries the first pinhole, the second stopper layer has a second pinhole penetrating the second stopper layer, and a part of the second repair layer buries the second pinhole.

6. The display device according to claim 2, wherein the first material is an ALD layer and the second material is a CVD layer.

7. The display device according to claim 2, wherein the first material includes $Al_2O_3$ and the second material includes SiO or SiN.

8. A display device comprising:

a first protection film including a first resin layer;

a first adhesive layer on the first protection film;

a first layer which is arranged on the first adhesive layer and includes a first material;

a second layer which is arranged on the first layer and includes a second material;

a first flexible substrate on the second layer;

a function layer which is arranged on the first flexile substrate and includes a plurality of pixels arranged in a matrix, each of the plurality of pixels including a thin film transistor and an organic emitting element connected to the thin film transistor; and a second flexible substrate on the function layer, wherein in plan view, each of the first protection film, the first adhesive layer, the first layer, the second layer, the first flexible substrate, and the second flexible substrate covers the plurality of pixels and the first material differs from the second material.

9. The display device according to claim 8, further comprising:

a sealing film which includes a first region having a first width and a second region having a second width; and a filler including a resin material, wherein the organic light emitting element includes an anode; an organic light emitting layer on the anode; and a cathode on the organic light emitting layer, the function layer includes an insulation bank which is between the anode and the cathode, covers a peripheral region of an upper surface of the anode, and expose a central region of the upper surface of the anode, and the first width directly above the peripheral region is smaller than the second width directly above the central region, and the first material is a first inorganic material and the second material is a second inorganic material.

10. The display device according to claim 8, wherein the second layer has a first pinhole penetrating the second layer, a part of the first layer buries the first pinhole.

11. The display device according to claim 8, wherein the first material is an ALD layer.

12. The display device according to claim 11, wherein the second material is a CVD layer.

13. The display device according to claim 8, wherein the first material includes $Al_2O_3$.

14. The display device according to claim 13, wherein the second material includes SiO or SiN.

* * * * *